US012800857B2

(12) United States Patent
Toma et al.

(10) Patent No.: US 12,800,857 B2
(45) Date of Patent: Nov. 17, 2026

(54) 3D HIGH BANDWIDTH MEMORY AND OPTICAL CONNECTIVITY STACKING

(71) Applicant: Google LLC, Mountain View, CA (US)

(72) Inventors: Horia Alexandru Toma, Sunnyvale, CA (US); Zuowei Shen, Los Altos, CA (US); Yujeong Shim, Cupertino, CA (US); Teckgyu Kang, Saratoga, CA (US); Jaesik Lee, San Jose, CA (US); Georgios Konstadinidis, San Jose, CA (US); Sukalpa Biswas, Fremont, CA (US); Hong Liu, Palo Alto, CA (US); Biao He, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 979 days.

(21) Appl. No.: 17/877,041

(22) Filed: Jul. 29, 2022

(65) Prior Publication Data

US 2024/0036278 A1 Feb. 1, 2024

(51) Int. Cl.

| | |
|---|---|
| ***G02B 6/42*** | (2006.01) |
| ***H01L 23/367*** | (2006.01) |
| ***H01L 23/473*** | (2006.01) |
| ***H01L 25/16*** | (2023.01) |

(52) U.S. Cl.

CPC ......... *G02B 6/4268* (2013.01); *G02B 6/4257* (2013.01); *G02B 6/4274* (2013.01); *H01L 23/3675* (2013.01); *H01L 23/473* (2013.01); *H01L 25/167* (2013.01)

(58) Field of Classification Search

CPC ... H01L 25/18; H01L 25/0657; H01L 25/167; H01L 23/3675; H01L 23/473; H01L 2225/06513; G02B 6/4268; G02B 6/4269; G02B 6/4271; G02B 6/4272; G02B 6/4257; G02B 6/4274

See application file for complete search history.

(56) References Cited

U.S. PATENT DOCUMENTS

| | | | | |
|---|---|---|---|---|
| 7,876,491 | B2 | 1/2011 | Ide et al. | |
| 8,155,534 | B2 | 4/2012 | Winzer | |
| 9,645,316 | B1 * | 5/2017 | Hasharoni | G02B 6/32 |
| 9,646,916 | B1 | 5/2017 | Emma | |
| 11,373,929 | B1 | 6/2022 | Refai-Ahmed et al. | |

(Continued)

FOREIGN PATENT DOCUMENTS

WO 2005038861 A2 4/2005

OTHER PUBLICATIONS

Extended European Search Report for European Patent Application No. 3157034.2 dated Nov. 28, 2023. 11 pages.

Lau. Recent Advances and New Trends in Nanotechnology and 3D Integration for Semiconductor Industry. 3D Systems Integration Conference (3DIC), 2011 IEEE International, IEEE, Jan. 31, 2012 (Jan. 31, 2012), pp. 1-23.

(Continued)

*Primary Examiner* — John M Parker

(74) *Attorney, Agent, or Firm* — Lerner David LLP

(57) ABSTRACT

The technology generally relates to high bandwidth memory (HBM) and optical connectivity stacking. Disclosed systems and methods herein allow for 3D-stacking of HBM dies that are interconnected with an optical interface in a manner that allows for compact, high-performance computing. An optical chiplet can be configured to be placed onto a stack of HBM dies, with a cooling die that is positioned between the HBM dies and the optical chiplet. The optical chiplet may be configured to connect the HBM optics module package to one or more other components of the package via to one or more optical fibers.

20 Claims, 6 Drawing Sheets

(56) References Cited

U.S. PATENT DOCUMENTS

| | | | | |
|---|---|---|---|---|
| 12,347,780 | B2 * | 7/2025 | Valavala | H01L 24/17 |
| 2009/0103855 | A1 | 4/2009 | Binkert et al. | |
| 2009/0284921 | A1 | 11/2009 | Colgan et al. | |
| 2013/0107901 | A1 * | 5/2013 | Deppe | B82Y 20/00 438/45 |
| 2013/0277855 | A1 * | 10/2013 | Kang | H01L 23/49816 257/774 |
| 2014/0376189 | A1 * | 12/2014 | Sakaguchi | H01L 23/49827 174/252 |
| 2016/0314091 | A1 | 10/2016 | Dutt et al. | |
| 2017/0186728 | A1 | 6/2017 | Chainer | |
| 2021/0257021 | A1 | 8/2021 | Meade et al. | |
| 2021/0407889 | A1 | 12/2021 | Qu et al. | |
| 2022/0092016 | A1 * | 3/2022 | Kumashikar | G06F 13/4068 |
| 2022/0399249 | A1 * | 12/2022 | Dogiamis | H01L 23/13 |
| 2023/0057025 | A1 * | 2/2023 | Lin | H01L 23/3736 |
| 2024/0421027 | A1 * | 12/2024 | Tong | H01L 25/50 |

OTHER PUBLICATIONS

Bakir et al. Revolutionary Innovation in System Interconnection: A New Era for the IC. Reliability, Packaging, Testing, and Characterization of MEMS/MOEMS and Nanodevices X, SPIE, 1000 20th St. Bellingham Wa 98225-6705 USA, vol. 7928, No. 1, Feb. 10, 2011 (Feb. 10, 2011), pp. 1-8.

Communication Under Rule 71(3) EPC for European Patent Application No. 23157034.2 dated Apr. 15, 2026. 29 pages.

Office Action for Chinese Patent Application No. 202310135632.8 dated May 9, 2026. 8 pages.

* cited by examiner

400

3D HIGH BANDWIDTH MEMORY AND OPTICAL CONNECTIVITY STACKING

BACKGROUND

High performance computing may require a plurality of high bandwidth memory ("HBM") dies. HBM may provide greater bandwidth while using less power as compared to other types of memory. As the performance requirements of packages increase, additional HBM dies may be necessary to provide the bandwidth and capacity for the increased performance. However, the number of HBM dies integrated in a package may be limited due to space constraints of the package, power constraints of the package, and/or the thermal constraints of the package.

BRIEF SUMMARY

The technology generally relates to high bandwidth memory (HBM) and optical connectivity stacking. Disclosed systems and methods herein allow for 3D-stacking of HBM dies that are interconnected with an optical interface in a manner that allows for high performance computing. The HBM optics module package may include one or more HBM dies, HBM chiplets, cooling dies, and optical chiplets. The optical chiplets may be configured to connect the HBM optics module package to one or more optical fibers that form an optical link with one or more other components of the package.

In accordance with aspects of the disclosure, a package may include one or more high-bandwidth memory (HBM) dies, an optical chiplet connected to one or more optical fibers and a cooling die located between the one or more HBM dies and the optical chiplet, wherein the cooling die contains an inlet for a cooling material, an outlet for a cooling material, one or more channels configured to transport the cooling material, and one or more vias for providing interface connections between the one or more HBM dies and the optical chiplet.

In accordance with another aspect, the cooling die may have a first surface oriented toward the optical chiplet and a second surface oriented toward the one or more HBM dies, and wherein each of the one or more vias comprises an aperture extending between the first surface and the second surface.

In accordance with yet another aspect, the one or more vias may be a plurality of vias distributed within a region of the cooling die, and the one or more channels may be configured to transport the cooling material between the vias within the region.

In accordance with another aspect, the vias may be distributed in a plurality of rows within the region and wherein the one or more channels are configured to transport the cooling material between the plurality of rows.

In accordance with still another aspect, the one or more HBM dies may be a plurality of HBM dies arranged in a stack having a footprint relative to a substrate, and wherein the cooling die may be configured so that it does not extend beyond the footprint of the HBM dies.

In accordance with another aspect, the cooling die may be a first surface oriented toward the optical chiplet, wherein the optical chiplet is configured to have a footprint that is smaller than the first surface of the cooling die so that a first region of the first surface is exposed relative to the optical chiplet, and wherein the first region contains the inlet and the outlet.

In accordance with yet another aspect, the flow of the cooling material may be controlled based on an operating temperature of HBM dies.

In accordance with another aspect, the one or more channels are peripherally located around the cooling die.

In accordance with still another aspect, the one or more channels may further comprise a plurality of microchannels.

In accordance with yet another aspect, the optical chiplet may be configured to be in communication with one or more application-specific integrated circuits (ASICs) via the one or more optical fibers.

In accordance with aspects of the disclosure, a system may include a first package; and a second package optically coupled to the first package, the second package may have one or more high-bandwidth memory (HBM) dies, an optical chiplet connected to one or more optical fibers, and a cooling die located between the one or more HBM dies and the optical chiplet, wherein the cooling die contains an inlet for a cooling material, an outlet for a cooling material, one or more channels configured to transport the cooling material, and one or more vias for providing interface connections between the one or more HBM dies and the optical chiplet, wherein the optical chiplet is configured to connect the second package to the first package via the one or more optical fibers.

DETAILED DESCRIPTION

Disclosed systems and methods herein provide an optics module package that allows for 3D-stacking of dies that are interconnected with an optical interface in a manner that allows for high performance computing. The dies may be, for example, high bandwidth memory (HBM) or other dies. The optics module package may include one or more HBM dies, HBM chiplets, cooling dies, and optical chiplets. The optical chiplet may be configured to connect the HBM optics module package to another package via an optical link that is established over one or more optical fibers.

As the performance requirements of computing packages increase, more HBM dies may be required to provide the memory bandwidth and capacity for the increased performance. For example, the increase in application specific integrated circuit (ASIC) performance requirement may limit how many HBM dies can be placed on the ASIC package. The available package size or the ASIC footprint may limit how many HBM dies are placed on the package. The package size may allocate a predetermined amount of space for HBM dies based on the other components that also have to be connected to the package. Therefore, the amount of space for HBM dies may be limited without enlarging the package. The number of HBM dies placed on the package may, additionally or alternatively, be limited based on the power and thermal constraints of the package. For example, including additional HBM dies on the package may cause an increase in thermal output. The increase in thermal output may exceed the thermal constraints of the package and, therefore, may damage components within the package and/or the package itself.

The optical links between the HBM optics module package and the ASIC package may allow for the HBM optics modules package and, therefore, the HBM dies to be positioned significantly further from an ASIC die as compared to when HBM dies are integrated within an ASIC package. As the connection between the HBM optics module package and ASIC package is an optical connection, little to no performance degradation results, even with the increased distance between the HBM dies and the ASIC package. The HBM optics module package may be configured to allow for high bandwidth and power, while maintaining thermal control for the package components.

Figure 1:
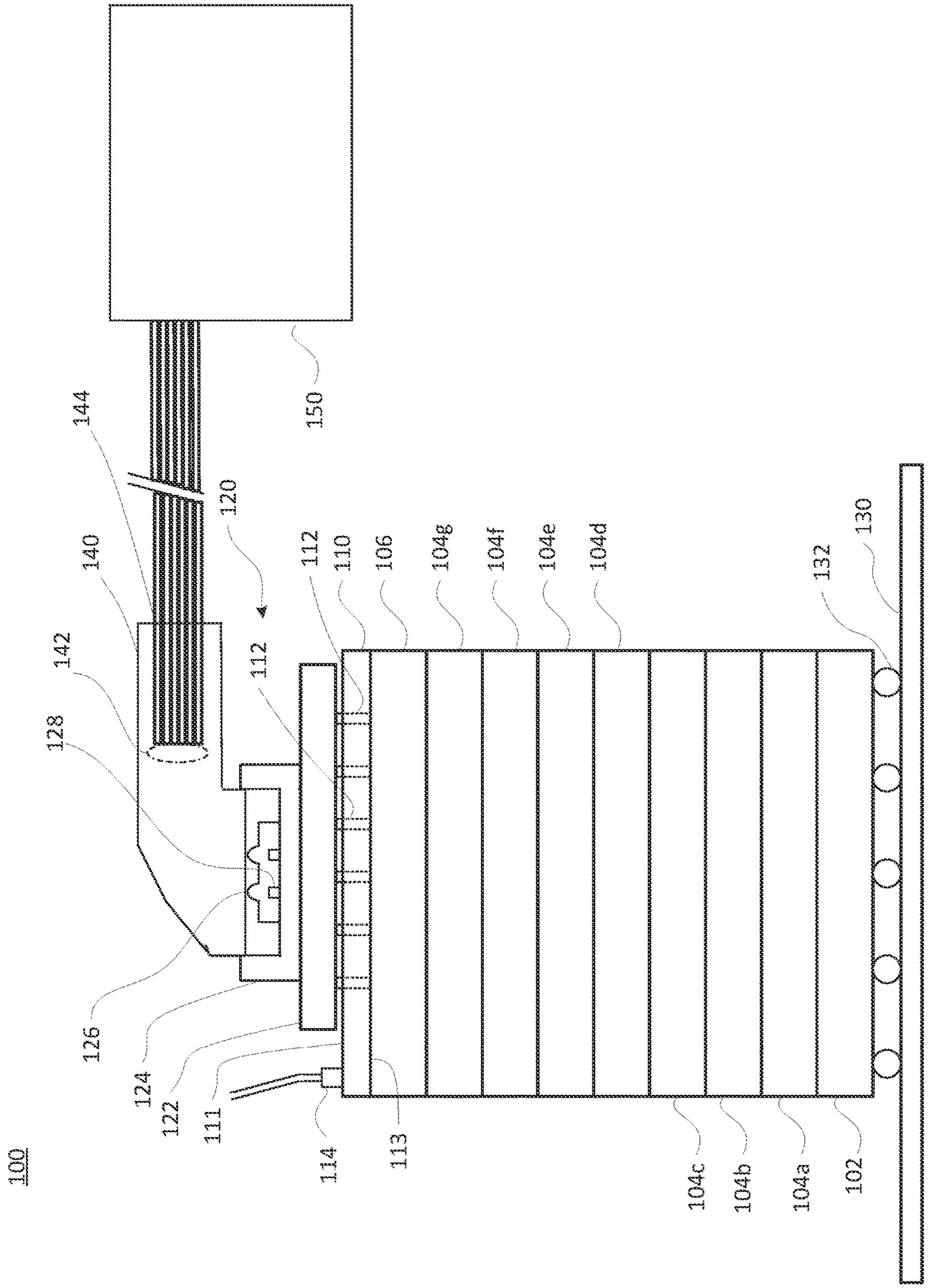
FIG. 1 illustrates an example package according to aspects of the disclosure.

In order to reduce the footprint of the HBM optics module on a substrate, the HBM dies may be stacked onto another, and the optical components may be positioned on top of the stack of HBM dies. FIG. 1 illustrates an optics module package 100. The package 100 may include a plurality of components, base die 102, a plurality of stacked HBM dies 104*a-g*, an DRAM optical interface die 106, a cooling die 110, and an optical chiplet 120. The base die 102 may be a dynamic random access memory (DRAM) configured to be electrically connected to a substrate 130. The package 100 may be powered via one or more electrical connections 132 between the base die 102 and the substrate 130. While package 100 is identified as containing DRAM components, alternative memory components may be used, such as dynamic flash memory (DFM) components.

A plurality of dies 104*a-g*, such as HBM dies, may be stacked onto base die 102, and each die may be electrically connected to adjacent dies so as to allow for HBM electrical signals to be passed through the stack. While the dies of FIG. 1 are identified as HBM dies, other memory devices may be used. Package 100 may be connected to one or more substrates, such as circuit boards, within the package 100. For instance, the components may be connected via one or more sockets to the main substrate 130 or sub-substrates connected to the main substrate. Package 100 may have dimensions that allow it to fit within other packages on preexisting substrates. By way of example only, package 100 may have a length and width relative to a substrate of around 11 mm by 11 mm, and it may have a height relative to the substrate of around 720 to 1000 um. In other examples, the package may have smaller or larger dimensions for length, width, or height.

DRAM optical interface die 106 may be placed at the top of the HBM stack. The DRAM optical interface die 106 may be configured to pass electrical signals from the HBM stack to an optical chiplet 120. DRAM optical interface die 106 may use one or more standard protocols, such as UCIe/CXL or one or more proprietary protocols that are designed for particular memory/optical systems. A cooling die 110 may be positioned between the DRAM optical interface die 106 and the optical chiplet 120. Cooling die 110 may be configured to contain a plurality of electrical vias 112, through which the electrical signals between the DRAM optical interface die 106 and optical chiplet may pass. For example, each via 112 may be a through-silicon via (TSV) that extends up from DRAM optical interface die 106 to come into electrical contact with the optical chiplet 120.

The optical chiplet 120 may be configured to convert the signals received from the HBM stack into an optical signal that can be transmitted over one or more optical fibers 140. The same optical chiplet 120 may also be configured to receive optical signals that can be converted to electrical signals for transmission to the stack of HBM dies. The optical chiplet 120 may be part of a light-bundle optical interconnect. The optical chiplet 120 may include a plurality of components, such as an interface 122, a frame 124, one or more optical collectors 126, and micro-LEDs 128. The interface 122 may be configured to receive the electrical signals that are passed through vias 112 from DRAM optical interface die 106. Interface 112 can be configured to convert the received electrical signal to an optical signal that can be transmitted by the micro-LEDs 128 and one or more collectors 126 in accordance with a light beam induced current protocol. As provided in FIG. 1, an optical fiber 140 may be attached to the frame of the optical chiplet 120 so that the optical signal is transmitted over the optical fiber 140. The optical fiber 140 may be a bundled optical fiber that supports a plurality of parallel optical channels 144. The optical fiber 140 may include one or more couplers 142 for transmission of the optical signals into the bundled optical fiber channels 144. The optical signal may be transmitted from package 100 over the optical fiber 140 to another package, such as an ASIC or another form of chip-to-chip communication The optical fiber 140 may connect from the optical chiplet 120 to a separate component. For example, the optical fiber channels 144 may connect the optical chiplet 120 to a package 150, such as an ASIC package. By coupling the optical fiber 140 to the optical chiplet 120, the HBM optics module package 100 may be disaggregated from package 150. In this regard, the optical fiber 140 may extend the channel reach between package 100 and the ASIC package as compared to an electrical connection between the HBM die(s) and the ASIC package.

Figure 2:
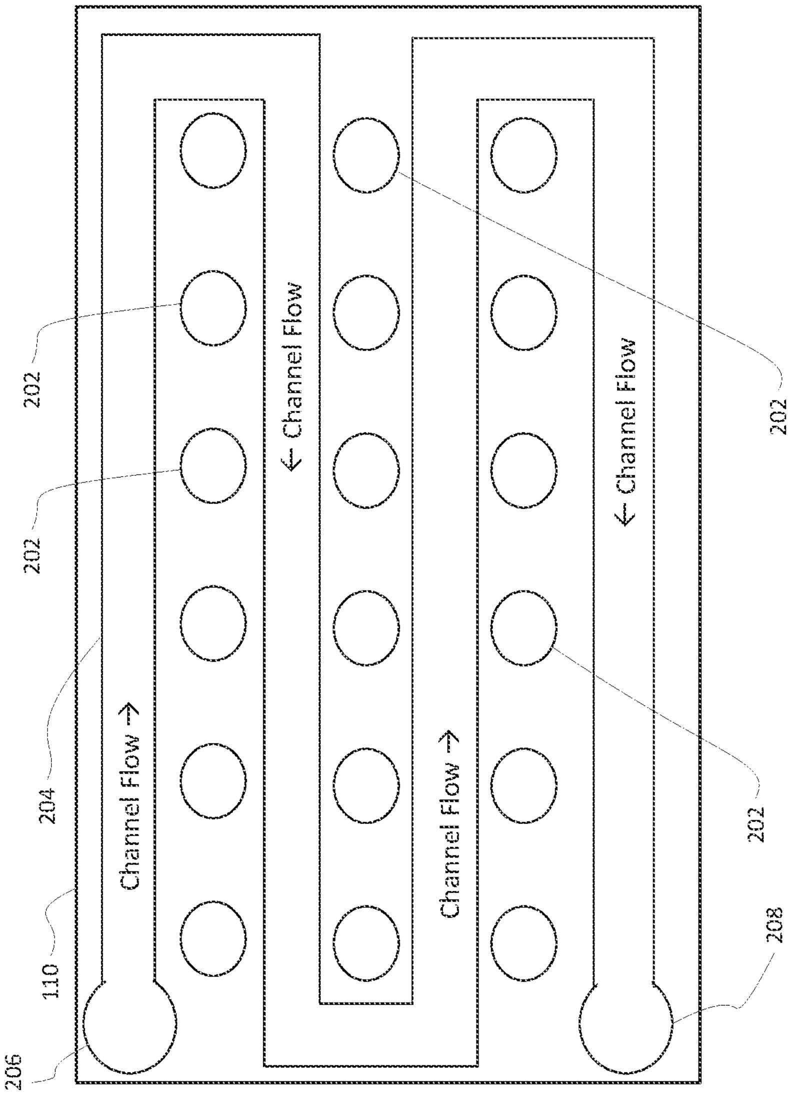
FIG. 2 illustrates a cross-sectional view of a cooling die in accordance with aspects of the disclosure.

With regard to cooling die 110, it may be connected to a coolant feed 114 that is used to circulate a cooling material, such as water, throughout the cooling die 110. Cooling die 110 may be configured to use any effective cooling material and flow rates to maintain a desirable temperature. For example, cooling die 110 may be configured to provide a cooling material and flow rate that is capable of maintaining a target temperature of approximately 65° C., with spikes of temperature up to approximately 105° C. Optical chiplet 120 may be configured so that its footprint is smaller than the top surface 111 of cooling die 112, and the coolant feed may be connected to the top surface 111 of cooling die 110. The vias 112 may be configured to travel along a plurality of apertures that extend between the top surface 111 and the bottom surface 113 of cooling die 110. FIG. 2 provides a cross-sectional view of cooling die 110 from the top surface, wherein a plurality of apertures 202 are shown. Around apertures 202 runs a coolant channel 204 through which coolant may flow. For example, a liquid coolant may be provided at inlet 206 (via coolant feed 114 shown in FIG. 1) and made to flow along channel 204 to outlet 208, where it is removed from cooling die 110. As it travels along coolant channel 204, the coolant will take in heat from the surrounding portions of the cooling die 110. Accordingly, the temperature of the coolant will tend to increase as it travels from inlet 206 to outlet 208.

The inlet temperature and inlet flow of the coolant can be controlled so as to control the amount of heat that is captured by the coolant and to control the temperature throughout the cooling die 110. In the configuration shown in FIG. 1, the cooling die 110 is positioned to capture the heat that is rising within the stack of HBM dies, so as to lower the operating temperature of the stack. In addition, the cooling die 110 is positioned between the optical chiplet 120 and the stack and can protect the optical chiplet 120 from being exposed to excessive heat of the stack. Thus, the cooling die 110 can prevent the operation of the optical chiplet 120 from being negatively impacted by heat that is produced by the HBM dies.

The stacked HBM dies 104 can be HBM DRAM dies that can transfer data with the DRAM optical interface die 106 at 200-400 MHz or more. The DRAM optical interface die 106 and the optical chiplet 420 may transfer data between 8 Gbps to 16 Gbps or more. The base die may be powered by a power source of 60-100 W or more. By cooling package 100 in the manner disclosed herein, package 100 may achieve higher connectivity speeds and operate more efficiently under various power ranges.

Figure 3:
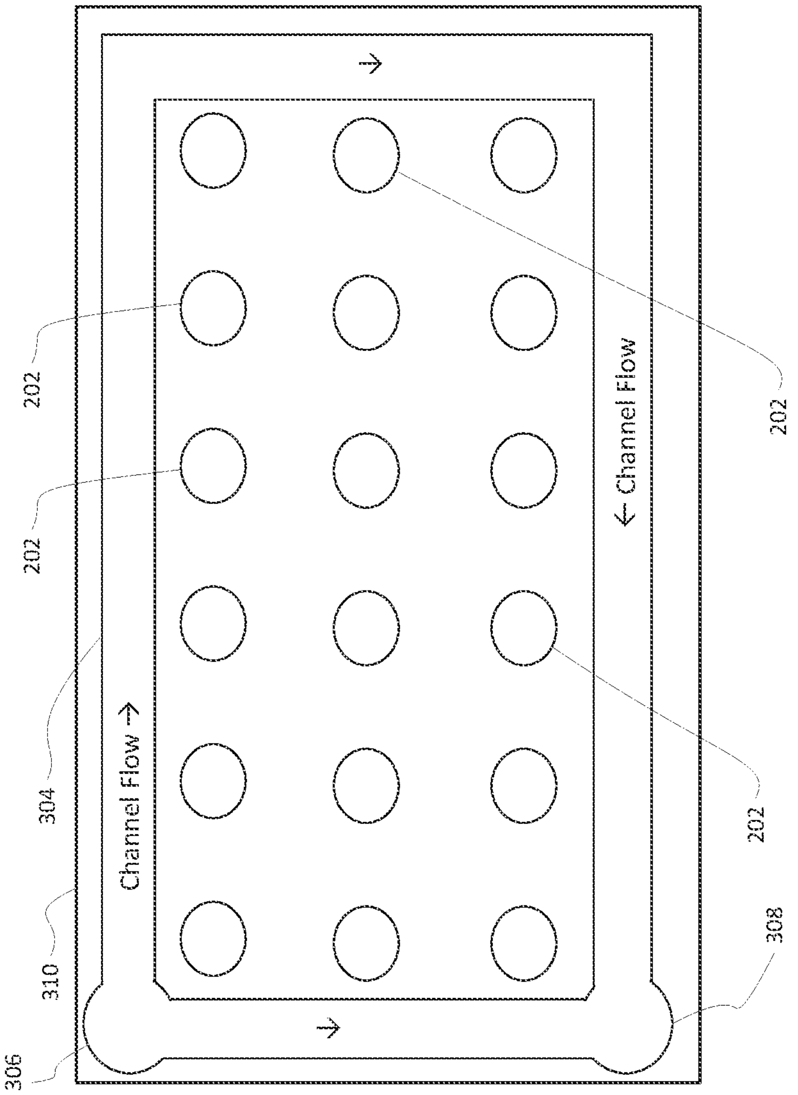
FIG. 3 illustrates a cross-sectional view of another cooling die in accordance with aspects of the disclosure.

FIG. 2 shows three rows of apertures 202 and a channel 204 that travels back-and-forth between the rows. In this manner, the coolant can be brought adjacent to multiple sides of each via aperture 202, and the coolant channel can be configured to be adjacent to substantially all of the top surface 111 and bottom surface 113 of the cooling die 110. The apertures 202 may also be arranged in alternative configurations to accommodate other configurations of vias between the interface die 106 and the optical chiplet 120. The channel may include a plurality of microchannels having a width, for example, on the order of 1 to 100 um that are a part of the cooling channel or that extend from a cooling channel of 100 to 10,000 um. The coolant channel 204 may also be alternatively configured within cooling die 110. For example, coolant channel 204 may be divided into a plurality of channels that allow for coolant to flow along the plurality of channels. In FIG. 3, coolant die 310 contains flow channels 304 that are arranged along the periphery of the cooling die 310. Accordingly, the coolant travels from the inlet 306 to the outlet 308 along the periphery of the cooling die 310.

Figure 4:
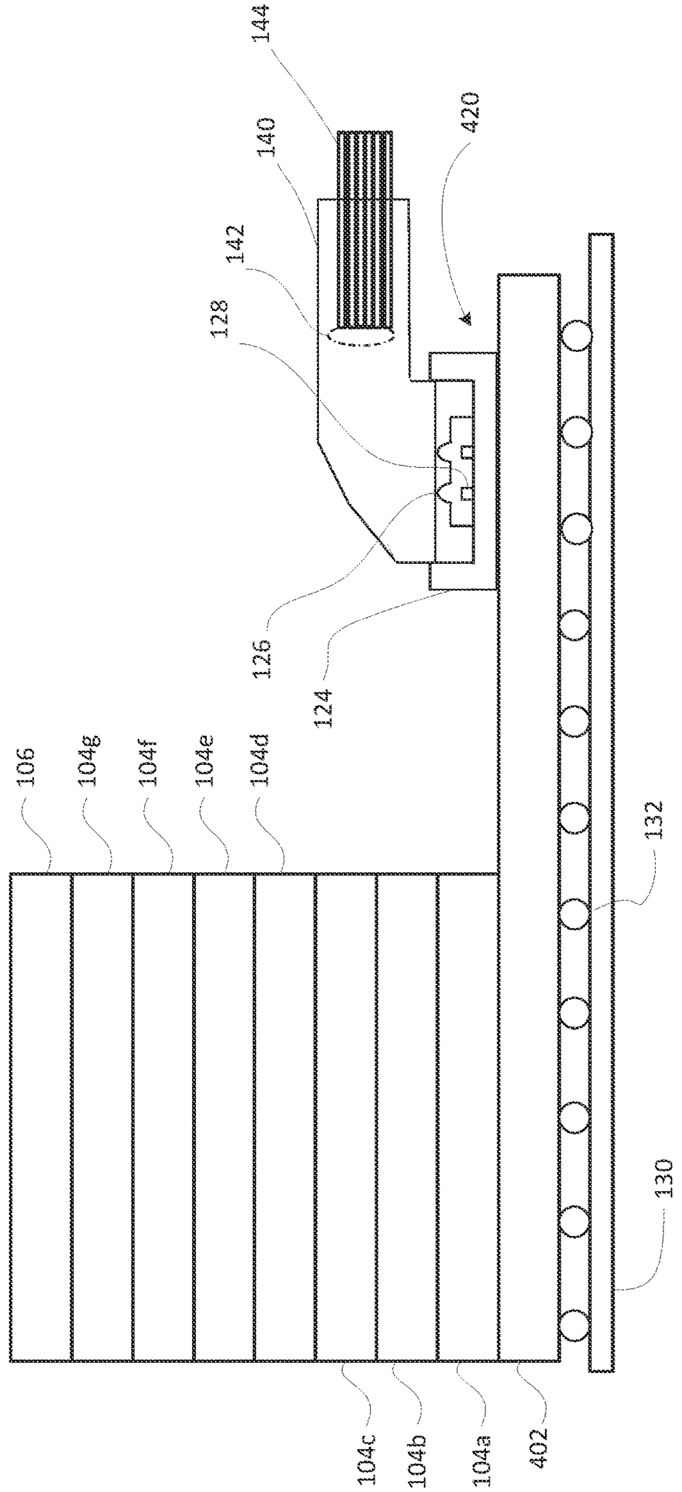
FIG. 4 illustrates another package according to aspects of the disclosure.

FIG. 4 is a package 400 in which the optical chiplet 420 is not located on the stack of HBM dies 102*a-g*. In package 400, optical interface base die 402 is used to transmit signals between the stack of dies 102*a-g* and the optical chiplet 420. In addition, package 400 allows for optical chiplet 420 to be physically distanced from the heat that is produced within the stack of dies 102*a-g*. However, the footprint of optical interface base die 402, relative to substrate 130, must be sufficiently large to accommodate the footprint of both the HBM dies 102*a-g* and the optical chiplet 420.

Figure 5:
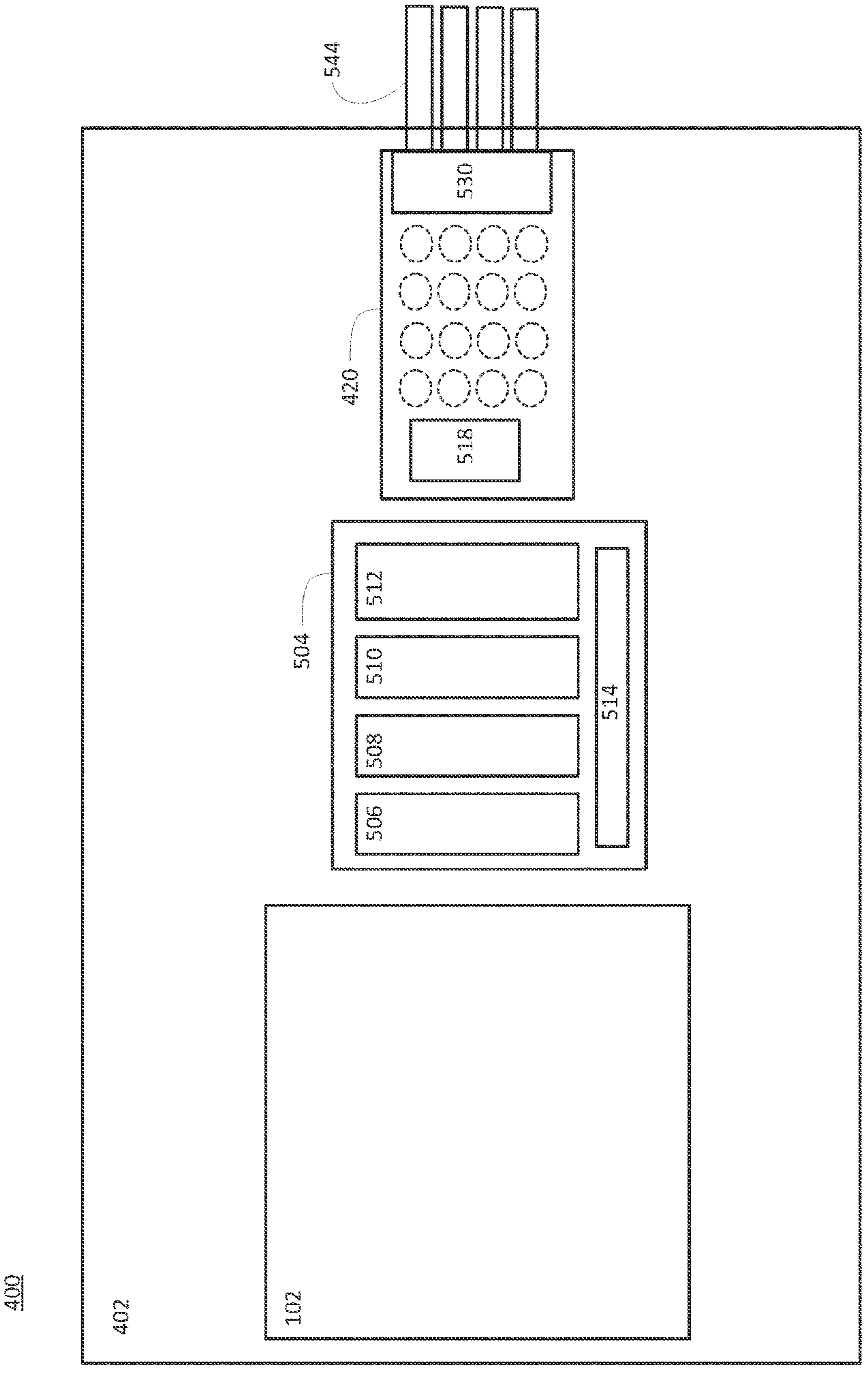
FIG. 5 illustrates a schematic view of a package according to aspects of the disclosure.

FIG. 5 illustrates schematic of an optics module package 400, in which a chiplet 504 is used to communicate signals between the die(s) 102 and optical chiplet(s) 420. The dies 102 may be HBM dies and chiplet 504 may be an HBM chiplet. Although FIG. 5 shows an example optics module package 400 with one HBM die 102, HBM chiplet 104, and optics chiplet 116, an optics module package can include any number of HBM dies 102, HBM chiplets 104, and optics chiplets 116.

Each component of the optics module package 400 may be connected to one or more substrates, such as circuit boards, within the optics module package 400. For instance, the components may be connected via one or more sockets to the main substrate 130 or sub-substrates connected to the main substrate. In some instances, each component may be removably connected to a substrate. In such a configuration, each component may be replaced with an upgraded component. In some examples, each component may be replaced if the component fails.

The HBM chiplet 504 may include a HBM physical interface ("PHY") 506, a HBM controller 508, an adaptor

510, a die-to-die ("D2D") interface 512, and a chip manager ("CM"), design for testing ("DFT"), and general purpose input/output ("GPIO") 514.

The HBM PHY 506 may, for example, receive commands from the HBM controller 508 and transmit the commands to the HBM die(s) 502. The HBM controller 108 may, for example, optimize the memory traffic and improve the overall performance of the HBM chiplet 504, HBM die(s) 102, and/or HBM optics module package 400. The adaptor 510 may allow for independent testing of the components on the HBM optics module package 400. The independent testing may be performed via one or more external interfaces.

The CM 414 may configure and manage the HBM chiplet 504, HBM die(s) 102, and/or the HBM optics module package 400.

The HBM chiplet 504 may be connected to both the HBM dies(s) 102 and the optical chiplet 420. The optical chiplet 420 may be connected to the HBM chiplet 504 via a D2D interface 518, 512. For example, the D2D 518 of the HBM chiplet 512 may communicate with a D2D 518 of the optical chiplet 420. The D2D interface 512, 518 may be a high-bandwidth interface ("HBI").

The optical chiplet 420 may include a D2D 518, one or more optical fibers 544, and a load balancing ("LB") physical interface ("PHY") 530. The optical fibers 544 may connect from the optical chiplet 420 to a separate component. For example, the optical fibers 544 may connect the optics chiplet 420 to an ASIC package. The LB PHY 530 may be configured to control the data being transmitted to and/or received from an ASIC package.

Figure 6:
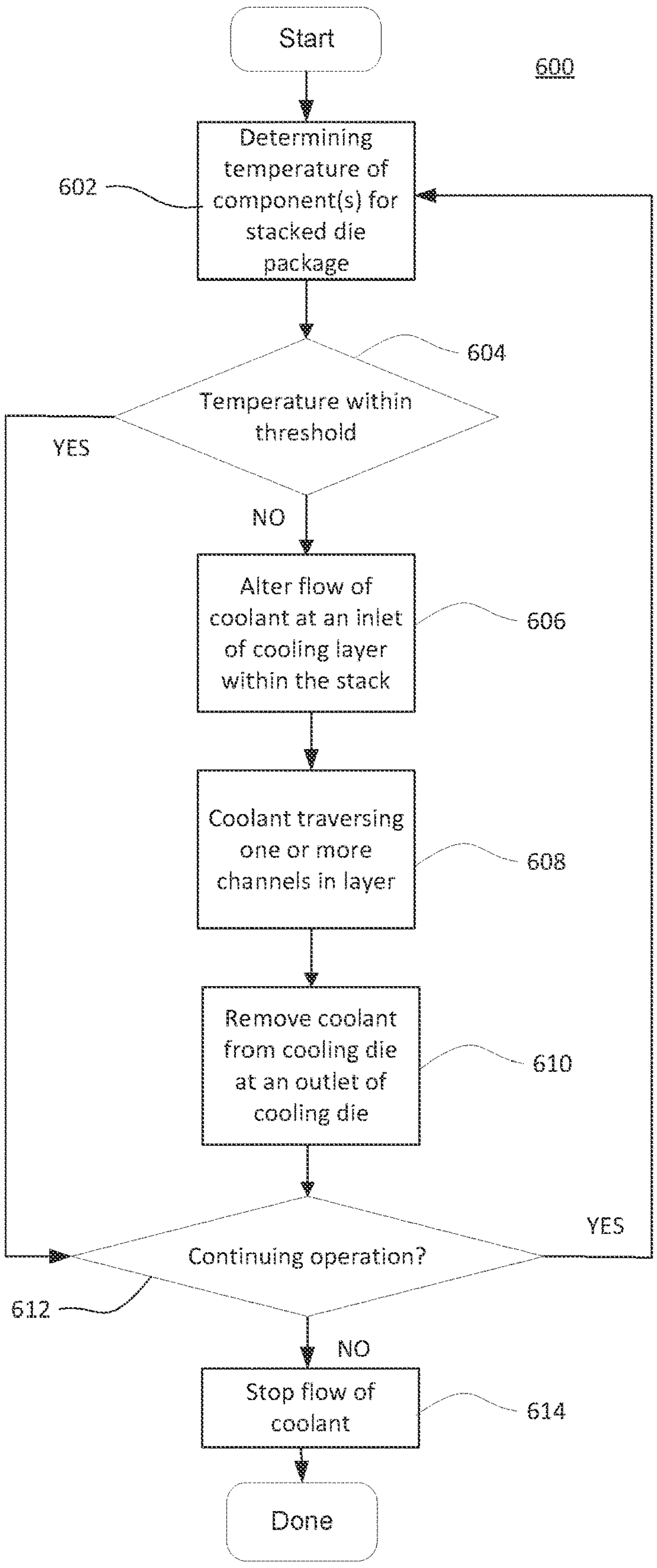
FIG. 6 is a flowchart in accordance with aspects of the disclosure.

FIG. 6 is a flow chart 600 that can be performed in connection with operation of a package, such as package 100 shown in FIG. 1. In accordance with the disclosure, some operations identified in flow chart 600 may be removed and other operations added. Some operations may also be performed in differing orders or in some cases simultaneously. Control of the operations performed in connection with flow chart 600 may be performed by control components within one or more dies within package 100. For example, base die 102 or optical interface die 106 may be configured to control cooling operations. At 602 of flow chart 600, a package controller may determine the temperature of one or more components within the package. For example, temperature data may be collected from temperature sensors to obtain the temperature of an optical chiplet and/or dies within the package. A determination may be made whether the temperature data is within a predetermined threshold for one or more of the components (604). If one or more of the components are not within the predetermined threshold, the flow of coolant can be altered within a cooling layer of the stack (606). For example, if it is determined that one or more components of the package exceed a desired temperature, the flow of coolant within a cooling die can be increased at an inlet for the cooling die.

The cooling die can be configured so that the coolant flows through one or more channels in the layer (608). As discussed above, the cooling die may be configured so that the channels traverse regions adjacent to one or more vias within the cooling die. Data may be transferred through the vias of the cooling die while coolant is flowing through the channels of the cooling die. At 610, coolant may be removed from the cooling die at an outlet location. As shown in FIG. 2, the outlet location may be positioned on the same side of the cooling die as the inlet location, while the one or more channels within the cooling die may be configured to allow the coolant to traverse from a first side of the cooling die to a second side of the cooling die a plurality of times. A determination may be made whether the package will continue to perform operations, such in providing or receiving optical communication from another device (612). If continued operations are to be performed, the package may return to determining the temperature of components in connection with step 602 and may continue to alter the flow in connection with the determined temperature. If the operations have come to an end, the flow of coolant at the inlet may be stopped (614).

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples. Further, the same reference numbers in different drawings can identify the same or similar elements.

The invention claimed is:

1. A package comprising:

one or more high-bandwidth memory (HBM) dies;

an optical chiplet connected to one or more optical fibers; and a cooling die located between the one or more HBM dies and the optical chiplet, wherein the cooling die contains an inlet for a cooling material, an outlet for a cooling material, one or more channels configured to transport the cooling material, and one or more vias for providing interface connections between the one or more HBM dies and the optical chiplet.

2. The package of claim 1, wherein the cooling die has a first surface oriented toward the optical chiplet and a second surface oriented toward the one or more HBM dies, and wherein each of the one or more vias comprises an aperture extending between the first surface and the second surface.

3. The package of claim 1, wherein the one or more vias comprise a plurality of vias distributed within a region of the cooling die, and wherein the one or more channels are configured to transport the cooling material between the vias within the region.

4. The package of claim 3, wherein the vias are distributed in a plurality of rows within the region and wherein the one or more channels are configured to transport the cooling material between the plurality of rows.

5. The package of claim 1, wherein the one or more HBM dies further comprise a plurality of HBM dies arranged in a stack having a footprint relative to a substrate, and wherein the cooling die is configured so that it does not extend beyond the footprint of the HBM dies.

6. The package of claim 1, wherein the cooling die has a first surface oriented toward the optical chiplet, wherein the optical chiplet is configured to have a footprint that is smaller than the first surface of the cooling die so that a first region of the first surface is exposed relative to the optical chiplet, and wherein the first region contains the inlet and the outlet.

7. The package of claim 1, wherein a flow of the cooling material is controlled based on an operating temperature of HBM dies.

8. The package of claim 1, wherein the one or more channels are peripherally located around the cooling die.

9. The package of claim 1, wherein the one or more channels further comprise a plurality of microchannels.

10. The package of claim 1, wherein the optical chiplet is configured to be in communication with one or more application-specific integrated circuits (ASICs) via the one or more optical fibers.

11. A system, comprising:

a first package; and a second package optically coupled to the first package, the second package comprising:

one or more high-bandwidth memory (HBM) dies;

an optical chiplet connected to one or more optical fibers; and a cooling die located between the one or more HBM dies and the optical chiplet, wherein the cooling die contains an inlet for a cooling material, an outlet for a cooling material, one or more channels configured to transport the cooling material, and one or more vias for providing interface connections between the one or more HBM dies and the optical chiplet;

wherein the optical chiplet is configured to connect the second package to the first package via the one or more optical fibers.

12. The system of claim 11, wherein the cooling die has a first surface oriented toward the optical chiplet and a second surface oriented toward the one or more HBM dies, and wherein each of the one or more vias comprises an aperture extending between the first surface and the second surface.

13. The system of claim 11, wherein the one or more vias comprise a plurality of vias distributed within a region of the cooling die, and wherein the one or more channels are configured to transport the cooling material between the vias within the region.

14. The system of claim 13, wherein the vias are distributed in a plurality of rows within the region and wherein the one or more channels are configured to transport the cooling material between the plurality of rows.

15. The system of claim 11, wherein the one or more HBM dies further comprise a plurality of HBM dies arranged in a stack having a footprint relative to a substrate, and wherein the cooling die is configured so that it does not extend beyond the footprint of the HBM dies.

16. The package of claim 11, wherein the cooling die has a first surface oriented toward the optical chiplet, wherein the optical chiplet is configured to have a footprint that is smaller than the first surface of the cooling die so that a first region of the first surface is exposed relative to the optical chiplet, and wherein the first region contains the inlet and the outlet.

17. The system of claim 11, wherein a flow of the cooling material is controlled based on an operating temperature of HBM dies.

18. The system of claim 11, wherein the one or more channels are peripherally located around the cooling die.

19. The system of claim 11, wherein the one or more channels further comprise a plurality of microchannels.

20. The system of claim 11, wherein the first package is an application-specific integrated circuit (ASIC), and wherein the optical chiplet of the second package is configured to be in communication with the ASIC via the one or more optical fibers.

* * * * *